(12) United States Patent
Lim et al.

(10) Patent No.: US 8,796,986 B2
(45) Date of Patent: Aug. 5, 2014

(54) BATTERY MANAGEMENT SYSTEM AND DRIVING METHOD THEREOF

(75) Inventors: Gye-Jong Lim, Suwon-si (KR);
Soo-Seok Choi, Suwon-si (KR);
Young-Jo Lee, Suwon-si (KR);
Yong-Jun Tae, Suwon-si (KR);
Han-Seok Yun, Suwon-si (KR);
Se-Wook Seo, Suwon-si (KR);
Beom-Gyu Kim, Suwon-si (KR);
Ho-Young Park, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 2105 days.

(21) Appl. No.: 11/896,274

(22) Filed: Aug. 30, 2007

(65) Prior Publication Data
US 2008/0100268 A1    May 1, 2008

(30) Foreign Application Priority Data
Nov. 1, 2006    (KR) .................. 10-2006-0107222

(51) Int. Cl.
*H02J 7/14*    (2006.01)
(52) U.S. Cl.
USPC ..................... 320/104; 320/136; 320/157
(58) Field of Classification Search
USPC ............... 320/136, 104, 157; 324/427, 429
See application file for complete search history.

(56) References Cited

U.S. PATENT DOCUMENTS

| | | |
|---|---|---|
| 5,153,496 A | 10/1992 | LaForge |
| 5,321,627 A | 6/1994 | Reher |
| 5,666,040 A | 9/1997 | Bourbeau |
| 5,701,068 A | 12/1997 | Baer et al. |
| 5,773,959 A | 6/1998 | Merritt et al. |
| 5,773,962 A | 6/1998 | Nor |
| 5,796,334 A | 8/1998 | Chen et al. |
| 5,952,815 A | 9/1999 | Rouillard et al. |
| 6,014,013 A | 1/2000 | Suppanz et al. |
| 6,078,165 A | 6/2000 | Ashtiani et al. |
| 6,104,166 A | 8/2000 | Kikuchi et al. |
| 6,127,806 A | 10/2000 | Tanjo et al. |

(Continued)

FOREIGN PATENT DOCUMENTS

| | | |
|---|---|---|
| CN | 1415973 A | 5/2003 |
| CN | 1604383 A | 4/2005 |

(Continued)

OTHER PUBLICATIONS

European Office Action issued by European Patent Office on Jan. 7, 2011 (the cross-referenced U.S. Appl. No. 11/583,118 in the Information Disclosure Statement filed on Jan. 9, 2011).

(Continued)

*Primary Examiner* — Edward Tso
*Assistant Examiner* — Aaron Piggush
(74) *Attorney, Agent, or Firm* — Robert E. Bushnell, Esq.

(57) ABSTRACT

A battery management system of a vehicle utilizing electrical energy and a driving method thereof is provided. The battery management system includes a sensing unit and a main control unit (MCU). The sensing unit detects voltage of a battery cell. MCU determines an operation state of a vehicle, and generates a sampling signal depending on the operation state of the vehicle. The sampling control signal transmits to the sensing unit, and controls the detection of the voltage of the battery cell. The operation state of the vehicle includes a running state and a stopping state.

9 Claims, 3 Drawing Sheets

(56) References Cited

U.S. PATENT DOCUMENTS

| | | | |
|---|---|---|---|
| 6,157,169 | A | 12/2000 | Lee |
| 6,255,826 | B1 | 7/2001 | Ohsawa et al. |
| 6,300,763 | B1 | 10/2001 | Kwok |
| 6,336,063 | B1 | 1/2002 | Lennevi |
| 6,362,627 | B1 * | 3/2002 | Shimamoto et al. .......... 324/434 |
| 6,377,030 | B1 | 4/2002 | Asao et al. |
| 6,411,063 | B1 | 6/2002 | Kouzu et al. |
| 6,472,880 | B1 | 10/2002 | Kang |
| 6,531,874 | B2 | 3/2003 | Mentgen et al. |
| 6,621,250 | B1 * | 9/2003 | Ohkubo et al. ............... 320/136 |
| 6,639,409 | B2 | 10/2003 | Morimoto et al. |
| 6,803,766 | B2 | 10/2004 | Kobayashi et al. |
| 7,126,342 | B2 | 10/2006 | Iwabuchi et al. |
| 2001/0035737 | A1 | 11/2001 | Nakanishi et al. |
| 2002/0030494 | A1 | 3/2002 | Araki et al. |
| 2002/0113595 | A1 | 8/2002 | Sakai et al. |
| 2003/0025481 | A1 | 2/2003 | Bertness |
| 2003/0146737 | A1 | 8/2003 | Kadouchi et al. |
| 2003/0189419 | A1 | 10/2003 | Maki et al. |
| 2004/0109274 | A1 | 6/2004 | Sato |
| 2005/0156603 | A1 | 7/2005 | Lin et al. |
| 2005/0179530 | A1 * | 8/2005 | Stewart et al. ................ 340/447 |
| 2005/0269991 | A1 | 12/2005 | Mitsui et al. |
| 2006/0028179 | A1 | 2/2006 | Yudahira et al. |
| 2006/0181245 | A1 | 8/2006 | Mizuno et al. |
| 2006/0202663 | A1 | 9/2006 | Cho et al. |
| 2007/0069734 | A1 * | 3/2007 | Bertness ....................... 324/411 |
| 2007/0090802 | A1 | 4/2007 | Seo |
| 2007/0090803 | A1 | 4/2007 | Yun et al. |
| 2008/0077339 | A1 | 3/2008 | Seo et al. |
| 2008/0091364 | A1 | 4/2008 | Lim et al. |

FOREIGN PATENT DOCUMENTS

| | | |
|---|---|---|
| CN | 1790857 A | 6/2006 |
| DE | 100 56 971 A1 | 5/2002 |
| EP | 0990913 | 4/2000 |
| EP | 1081499 A1 | 3/2001 |
| EP | 1203964 | 5/2002 |
| EP | 1 271 171 A2 | 1/2003 |
| EP | 1 314 992 A2 | 5/2003 |
| EP | 1 555 537 A1 | 7/2005 |
| EP | 1841003 A1 | 10/2007 |
| JP | 06231806 | 8/1994 |
| JP | 11160367 | 6/1999 |
| JP | 2000-069606 | 3/2000 |
| JP | 2000-134705 | 5/2000 |
| JP | 2000-217261 | 8/2000 |
| JP | 2000-228832 | 8/2000 |
| JP | 2000-324702 | 11/2000 |
| JP | 2000-340267 | 12/2000 |
| JP | 2000-357541 | 12/2000 |
| JP | 2001-086656 | 3/2001 |
| JP | 2001-116776 | 4/2001 |
| JP | 2002042906 | 2/2002 |
| JP | 2002-199510 | 7/2002 |
| JP | 2003-084015 | 3/2003 |
| JP | 2003134675 | 5/2003 |
| JP | 2004079324 | 3/2004 |
| JP | 2004-180397 | 6/2004 |
| JP | 2004-222433 | 8/2004 |
| JP | 2005-269752 | 9/2005 |
| JP | 2006-014480 | 1/2006 |
| JP | 2006-047130 | 2/2006 |
| KR | 19920009697 | 9/1989 |
| KR | 1997-0048597 A | 7/1997 |
| KR | 1998064646 | 10/1998 |
| KR | 0216808 B1 | 6/1999 |
| KR | 2001-0043872 A | 5/2001 |
| KR | 20020064998 | 8/2002 |
| KR | 2003-0065757 A | 8/2003 |
| KR | 20040005133 A | 1/2004 |
| KR | 20040092943 | 11/2004 |
| KR | 20040111144 | 12/2004 |
| KR | 2005-0019856 A | 3/2005 |
| KR | 20050026360 A | 3/2005 |
| KR | 20050089816 | 9/2005 |
| KR | 0534818 A | 12/2005 |
| KR | 2006-0059680 A | 6/2006 |
| KR | 2006-0094897 A | 8/2006 |
| KR | 20070003628 A | 1/2007 |
| KR | 20070029937 A | 3/2007 |
| KR | 10-2006-0079505 | 7/2008 |
| WO | 2007007655 | 1/2007 |

OTHER PUBLICATIONS

Search Report from the European Patent Office in Applicant's corresponding European Patent Application No. 07118640.1 dated on May 8, 2008.

State of charge (Wikipedia—2 pages) print out from http://en.wikipedia.org/wiki/State_of_charge.

Custom Power Solutions (10 pages) print out from http://www.mpoweruk.com/soc.htm.

Chinese Dicision of Rejection and its English translation issued on Apr. 1, 2011 in corresponding Chinese Patent Application No. 200810082790.7 of the corresponding cross-referenced U.S. Appl. No. 12/078,426 in information Disclosure Statement filed on May 23, 2011.

Chinese Office action issued by SIPO on Dec. 8, 2011, corresponding to Chinese Patent Application No. 200710161634.5 and its English Translation attached herewith.

* cited by examiner

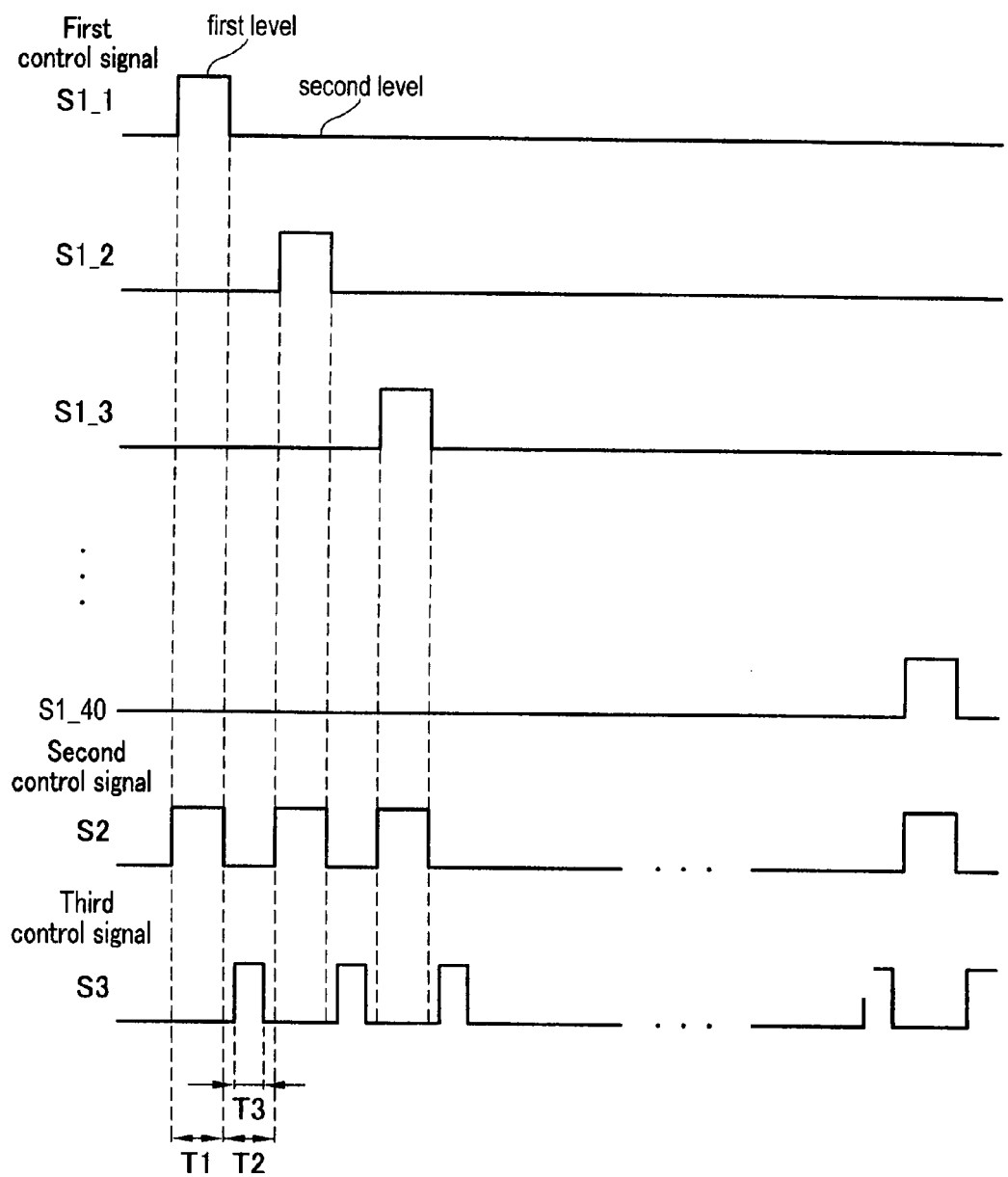

BATTERY MANAGEMENT SYSTEM AND DRIVING METHOD THEREOF

CLAIM OF PRIORITY

This application makes reference to, incorporates the same herein, and claims all benefits accruing under 35 U.S.C. §119 from an application for BATTERY MANAGEMENT SYSTEM AND DRIVING METHOD THEREOF earlier filed in the Korean Intellectual Property Office on the 1 Nov. 2006 and there duly assigned Ser. No. 10-2006-0107222.

BACKGROUND OF THE INVENTION

1. Field of the Invention

The present invention relates to a battery management system. More particularly, the present invention relates to a battery management system of a vehicle utilizing electrical energy and a driving method thereof.

2. Description of the Related Art

Vehicles using a gasoline or diesel internal combustion engine have caused serious air pollution. Accordingly, various efforts for developing electric or hybrid vehicles have recently been made to reduce air pollution.

An electric vehicle has an electric motor that can be driven by electrical energy that is output by a battery. The main power source of the electric vehicle is a battery, which is formed as a pack that includes a plurality of rechargeable secondary battery cells, and therefore the electric vehicle produces no emission gases and makes less noise than a vehicle using a gasoline or diesel internal combustion engine.

A hybrid vehicle commonly refers to a gasoline-electric hybrid vehicle that has a gasoline combustion engine to produce electricity, and an electric battery that stored the electricity and drives an electric motor with the stored electricity. Recently, hybrid vehicles using an internal combustion engine and fuel cells, and hybrid vehicles using a battery and fuel cells have been developed. The fuel cell directly produces electrical energy through chemical reaction while hydrogen and oxygen are continuously provided to the fuel cell.

In a vehicle using an electric motor, the number of rechargeable batteries or battery cells has increased in order to improve power of the vehicle. Therefore, a cell balancing control method, which is capable of efficiently managing a plurality of coupled battery cells, is required for a battery management system (BMS).

In order to efficiently balance the battery cells, which are coupled to each other, voltage measurement of each battery cell is necessary. The contemporary method of the voltage measurement, however, has a problem in accuracy.

The above information disclosed in this background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a battery management system having advantages of preventing errors in detection of voltage of a battery cell by controlling the detection process depending on an operation state of a vehicle.

An exemplary embodiment of the present invention provides a battery management system coupled to a battery cell of a vehicle. The battery management system includes a sensing unit coupled to the battery cell where the sensing unit detects voltage of the battery cell, and a main control unit coupled to the sensing unit. The main control unit determines an operation state of the vehicle, and generates one of at least two sampling signals depending on the operation state of the vehicle. The main control unit transmits the one of at least two sampling signals to the sensing unit.

The sampling signals may includes a first sampling signal and a second sampling signal. The main control unit generates the first sampling signal whenever the vehicle is in a running state, and generates the second sampling signal whenever the vehicle is in a stopping state.

Each of the first sampling signal and the second sampling signal may include a first control signal having a first level and a second level, a second control signal having a first level and a second level, and a third control signal having a first level and a second level. The first level of the third control signal is applied during a time period in which the first control signal is at the second level of the first control signal and the second control signal is at the second level of the second control signal.

The first level of the first control signal of the first sampling signal is applied during a first time period of the first sampling signal, and the first level of the first control signal of the second sampling signal is applied during a first time period of the second sampling signal. The first time period of the first sampling signal may be shorter than the first time period of the second sampling signal.

The sensing unit may include a cell relay coupled to the battery cell where the cell relay receiving the first control signal from the main control unit, a first relay coupled to the cell relay where the first relay receiving the second control signal from the main control unit, a capacitor coupled to the first relay, a second relay coupled to the capacitor where the second relay receiving the third control signal from the main control unit, and a differential amplification terminal coupled to the second relay where the differential amplification terminal detecting the voltage of the battery cell and amplifying the voltage of the battery cell.

Another exemplary embodiment of the present invention provides a driving method of a battery management system including steps of determining an operation state of the vehicle, generating a first sampling signal whenever the vehicle is in a running state, generating a second sampling signal whenever the vehicle is in a stopping state, and detecting voltage of the battery cell by applying either the first sampling signal or the second sampling signal to a sensing unit of the battery management system.

The step of detecting voltage of the battery cell may include steps of turning on a cell relay that is coupled to the battery cell during a first time period to electrically connect the battery cell to a first relay, turning on the first relay during the first time period to electrically connect the cell relay to a capacitor, turning off the cell relay during a second time period to electrically disconnect the first relay from the battery cell, turning off the first relay during the second time period to electrically disconnect the capacitor from the cell relay, and turning on a second relay that is coupled to the capacitor during the second time period to electrically connect the capacitor to a differential amplifying terminal.

The step of turning on the cell relay may include steps of applying a first level of a first control signal of the first sampling signal whenever the vehicle is in the running state, and applying a first level of a first control signal of the second sampling signal whenever the vehicle is in the stopping state. The step of turning on the first relay may include steps of applying a first level of a second control signal of the first sampling signal whenever the vehicle is in the running state, and applying a first level of a second control signal of the second sampling signal whenever the vehicle is in the stopping state. The step of turning on the second relay may include steps of applying a first level of a third control signal of the first sampling signal whenever the vehicle is in the running state, and applying a first level of a third control signal of the second sampling signal whenever the vehicle is in the stopping state.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 illustrates a waveform of a first control signal, a second control signal, and a third control signal that are generated to control the voltage sensing unit of the BMS, which is constructed as an exemplary embodiment of the present invention.

DETAILED DESCRIPTION OF THE EMBODIMENTS

Figure 1:
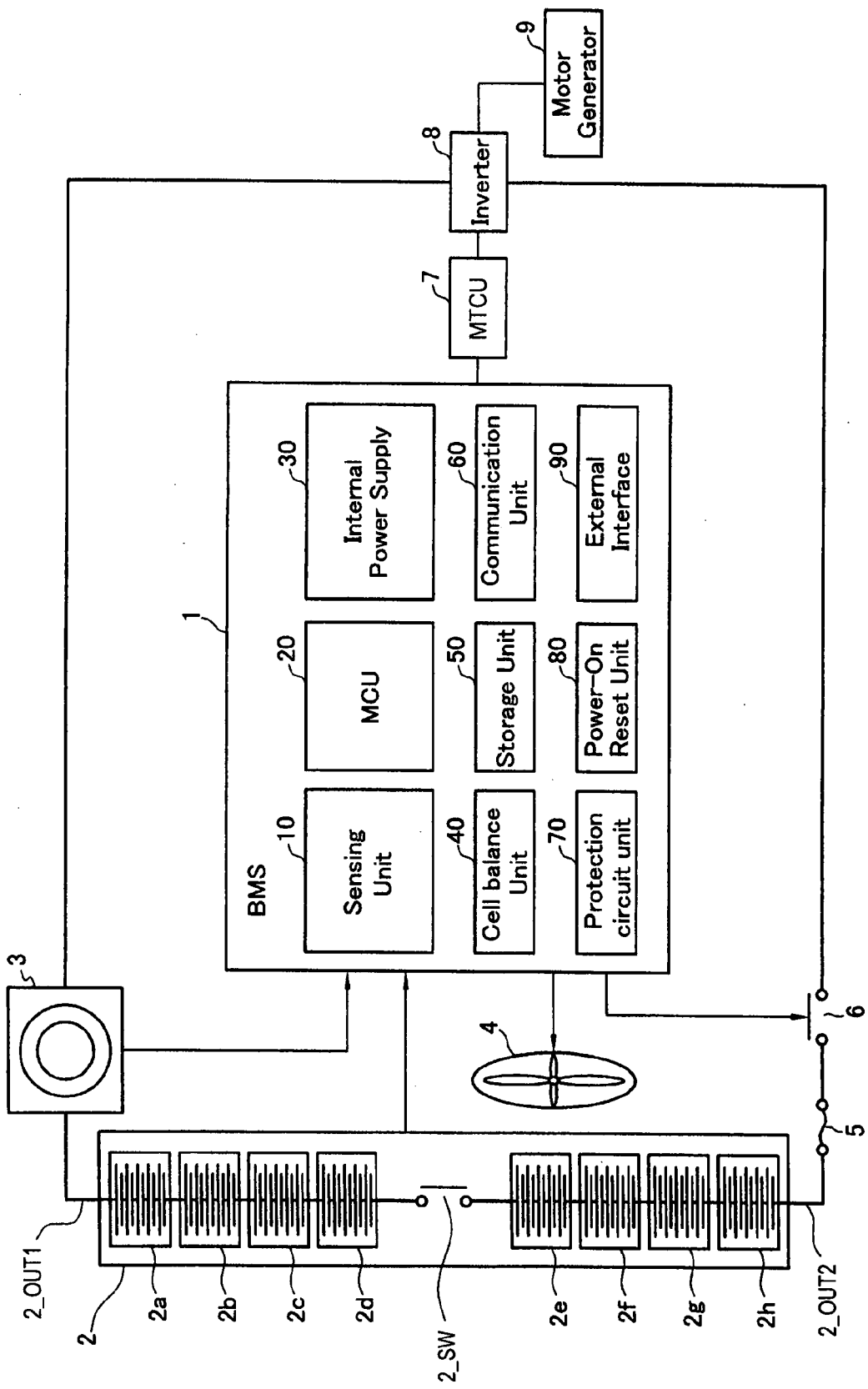
FIG. 1 schematically illustrates a battery, a battery management system (BMS), and peripheral devices of BMS, which are constructed as an exemplary embodiment of the present invention.

In the following detailed description, only exemplary embodiments of the present invention are shown and described, simply by way of illustration. As those skilled in the art would realize, the described embodiments may be modified in various different ways, without departing from the spirit or scope of the present invention. Accordingly, the drawings and description are to be regarded as illustrative in nature and not restrictive. Like reference numerals designate like elements throughout the specification.

Throughout this specification and the claims, when it is described that an element is "coupled to" another element, the element may be "directly coupled" to the another element or "indirectly coupled" to the another element through a third element. Throughout this specification and the claims which follow, unless explicitly described to the contrary, the word "comprise/include", or variations such as "comprises/includes" or "comprising/including", will be understood to imply the inclusion of stated elements but not the exclusion of any other elements.

FIG. 1 schematically illustrates a battery, a battery management system, and peripheral devices thereof. As shown in FIG. 1, a motor system includes battery management system (BMS) 1, battery 2, current sensor 3, cooling fan 4, fuse 5, main switch 6, motor control unit (MTCU) 7, inverter 8, and motor generator 9.

Battery 2 includes a plurality of sub-packs 2a to 2h, each of which includes a plurality of battery cells coupled in series with each other. Output terminals 2_OUT1 and 2_OUT2 are formed at ends of battery 2, and safety switch 2_SW is provided between sub-pack 2d and sub-pack 2e. Herein, eight sub-packs 2a to 2h are exemplarily illustrated, and each sub-pack is formed by grouping a plurality of battery cells in one group, but the number of sub-packs and the number of battery cells included in each sub-pack are not restrictive. Safety switch 2_SW, which is provided between sub-pack 2d and sub-pack 2e, can be manually turned on or off when an user changes a battery or performs a battery-related operation. In the exemplary embodiment, safety switch 2_SW is provided between sub-pack 2d and sub-pack 2e, but safety switch 2_SW can be provided between any two sub-packs, and the location of safety switch 2_SW is not restrictive. Output terminals 2_OUT1 and 2_OUT2 are coupled to inverter 8.

Current sensor 3 measures an amount of output current of battery 2, and outputs the measured amount to sensing unit 10 of BMS 1. In detail, current sensor 3 may be provided as a hall current transformer (Hall CT) that measures an amount of output current by using a hall element, and outputs an analog current signal corresponding to the measured amount.

Cooling fan 4, in response to a control signal from BMS 1, dissipates heat generated during charging/discharging processes of battery 2. Therefore, cooling fan 4 prevents deterioration and reduction of charging/discharge efficiency of battery 2, which can be caused by temperature increase of battery 2.

Fuse 5 prevents high current, which may be caused by a disconnection or a short circuit of battery 2, from being transmitted to battery 2. That is, when current overflows, fuse 5 is decoupled so as to interrupt the high current from flowing into battery 2.

Main switch 6 turns on or turns off battery 2 in response to a control signal from BMS 1 or from MTCU 7, whenever an unusual phenomenon, including over-voltage, over-current, and high temperature, occurs.

BMS 1 includes sensing unit 10, main control unit (MCU) 20, internal power supply 30, cell balance unit 40, storage unit 50, communication unit 60, protection circuit unit 70, power-on reset unit 80, and external interface 90.

According to an exemplary embodiment of the present invention, an operation state of a vehicle includes a running state and a stopping state. A vehicle in this specification is defined to include a transportation means such as an automobile, a locomotive, a boat, and a ship, and also to include a device that produces a mechanical motion such as a mill. The running state of the vehicle is defined as a state in which the vehicle is operated for its purpose. The stopping state of the vehicle is defined to include a state in which the operation of the vehicle for its purpose stops. Examples of the running state of the vehicle may include driving a car at a predetermined speed and driving a coffee mill to grind coffees. Examples of the stopping state of the vehicle may include parking a car with the engine idling and stopping of the operation of a coffee mill.

Sensing unit 10 measures a battery voltage according to a sampling time that depends on the running or the stopping state. Hereinafter, a voltage between output terminals of the battery is referred to as a battery voltage. Sensing unit 10 transmits the measured battery voltage to MCU 20.

MCU 20 detects an operation state of a vehicle, and sets different sampling times according to the operation state, whenever BMS 1 measures each cell voltage or each battery module voltage of the battery. MCU 20 performs high-speed sampling in the running state for stability of battery, and performs low-speed sampling in the stopping state so as to correctly measure each cell voltage or each battery module voltage.

In addition, MCU 20 estimates a state of charge (SOC) and a state of health (SOH) based on the battery voltage transmitted from sensing unit 10, and accordingly performs charging and discharging of battery 2.

Internal power supply 30 supplies power to BMS 1 by using a backup battery. Cell balance unit 40 balances the charging stage of each cell. That is, cells that are relatively highly charged are discharged, and cells that are relatively less charged are further charged. Storage unit 50 stores data of a current SOC or SOH when the power source of BMS 1 is turned off.

Communication unit 60 communicates with MTCU 7 of the vehicle system. Protection circuit 70 is a circuit for protecting battery 2 from an external impact, an over-current, or low voltage by using firmware. Power-on reset unit 80 resets the overall system when the power source of BMS 1 is turned on. External interface 90 is for coupling auxiliary devices of BMS 1, such as cooling fan 4 and main switch 6, to MCU 20. In the present exemplary embodiment, cooling fan 4 and main switch 6 are illustrated as auxiliary devices of BMS 1, but this is not restrictive. Another device can be further added as the auxiliary device.

MTCU 7 detects an operation state of a vehicle based on the state of accelerator or brake of the vehicle, or speed information of the vehicle. MTCU 7, then, determines necessary information such as an amount of torque, and controls an output of motor-generator 9 in correspondence to the torque information. That is, MTCU 7 controls an output of motor generator 9 in accordance with the torque information by controlling inverter 8. Also, MTCU 7 receives the SOC of battery 2 from MCU 20 through communication unit 60 of BMS 1, and controls the SOC of battery 2 to reach a target value (e.g., 55%). For example, when the SOC transmitted from MCU 20 is lower than 55%, MTCU 7 controls electric power of an external source to flow into battery 2 by controlling the switch of inverter 8 to thereby charge battery 2. At this time, a pack current, which is a current flowing from or to battery 2, may have a positive (+) value. When the SOC is higher than 55%, MTCU 7 controls electric power of battery 2 to flow into motor generator 9 by controlling the switch of inverter 8 to discharge battery 2. At this time, the pack current may have a negative (−) value.

Inverter 8 charges or discharges battery 2 in response to a control signal of MTCU 7. Based on the torque information transmitted from MTCU 7, motor generator 9 drives the vehicle by using electrical energy of battery 2.

Figure 2:
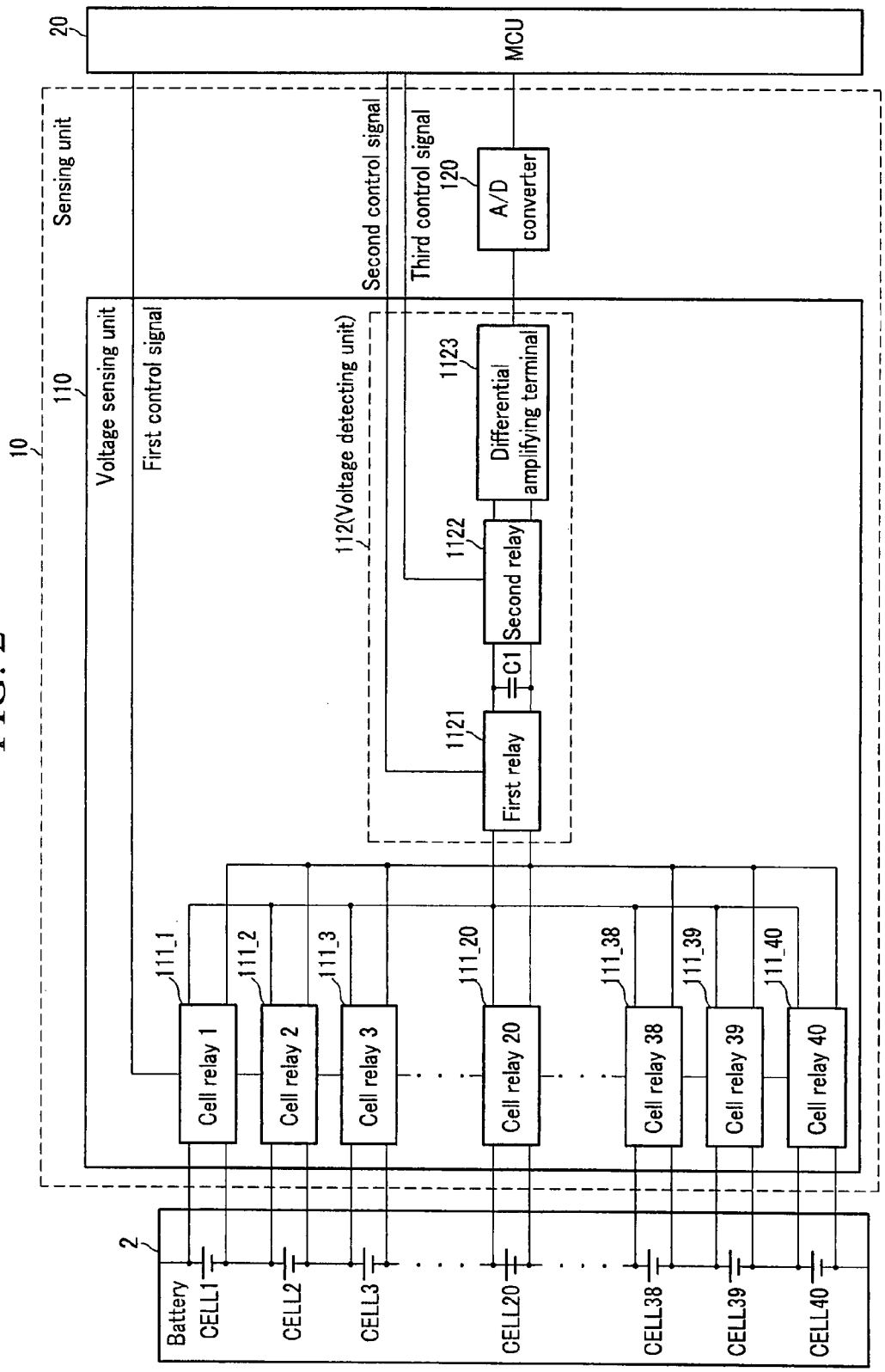
FIG. 2 schematically illustrates a sensing unit and a voltage sensing unit of the BMS, which is constructed as an exemplary embodiment of the present invention.

FIG. 2 schematically illustrates a sensing unit and a voltage sensing unit, which is constructed as an exemplary embodiment of the present invention. As shown in FIG. 2, sensing unit 10 includes voltage sensing unit 110. Voltage sensing unit 110 includes cell relays 111_1 to 111_40, first relay 1121, second relay 1122, capacitor C1, and differential amplifying terminal 1123. Voltage sensing unit 110 receives first control signals S1_1 to S1_40, second control S2, and third control signal S3 from MCU 20. The process of detecting voltage of each battery cell with control signals S1_1 to S1_40, S2, and S3 will be described in more detail.

Cell relays 111_1 to 111_40 are connected to battery cells CELL1 to CELL40 of battery 2, respectively. A number of the battery cells can be grouped in a sub-pack as shown in FIG. 1, but the sub-pack is not illustrated in FIG. 2. The cell relay is connected to a positive terminal and a negative terminal of the battery cell. Cell relays 111_1 to 111_40 transmit voltage of the battery cells (cell voltage) to voltage detecting unit 112 in response to first control signals S1_1 to S1_40 transmitted from MCU 20.

MCU 20 controls cell relays 111_1 to 111_40, first relay 1121, and second relay 1122, and accordingly enables voltage detecting unit 112 to detect voltage of each cell of battery 2. In an embodiment of the present invention, MCU 20 generates two different types of sampling signals depending on an operation state of a vehicle. MCU 20 generates a first sampling signal if the vehicle is in the running state. MCU 20 generates a second sampling signal if the vehicle is in the stopping state. Each of the first sampling signal and the second sampling signal includes first control signal S1_1 to S1_40, second control S2, and third control signal S3. Controls signals S1_1 to S1_40, S2, and S3 of the first and the second sampling signals, however, have different configurations to efficiently detect the voltages of the battery cells at different operation states of the vehicle.

MCU 20 generates first control signals S1_1 to S1_40, and transmits first control signal so as to control cell relays 111_1 to 111_40. Each of cell relays 111_1 to 111_40 is sequentially turned on to electrically connect the corresponding battery cell to voltage detecting unit 112 in response to first control signals S1_1 to S1_40. Voltage detecting unit 112 detects the voltage of the battery cell that is currently connected through the cell relay. In detail, MCU 20 first identifies whether the vehicle is in a running state or in a stopping state. MCU 20 accordingly generates different first control signals S1_1 to S1_40 based on the identified operation state of the vehicle. Each of the first control signals has a first level and a second level. Each of cell relays 111_1 to 111_40 is turned on at the first level of the corresponding first control signal, and is turned off at the second level of the corresponding first control signal. Waveforms of the first control signals of the first sampling signal are different from the waveforms of the first control signals of the second sampling signal.

First control signals S1_1 to S1_40 may be transmitted to cell relays 111_1 to 111_40, respectively, through multiple transmission lines, each of which transmits each of first control signals S1_1 to S1_40.

Voltage detecting unit 112 includes capacitor C1, first relay 1121, second relay 1122, and differential amplification terminal 1123. First relay 1121 receives second control signal S2 from MCU 20, and second relay 1122 receives third control signal S3 from MCU 20. Each of second control signal S2 and third control signal S3 has a first level and a second level. First relay 1121 is turned on at the first level of second control signal S2, and is turned off at the second level of second control signal S2. Second relay 1122 is turned on at the first level of third control signal S3, and is turned off at the second level of third control signal S3. If first relay 1121 is turned on, first relay 1121 receives a cell voltage from one of cell relays 111_1 to 111_40, and transmits the cell voltage to capacitor C1. In other words, if first relay 1121 is turned on, first relay 1121 electrically connects one of cell relays 111_1 to 111_40 to capacitor C1, and if first relay 1121 is turned off, first relay 1121 electrically disconnect capacitor C1 from one of cell relays 111_1 to 111_40. The meanings of turning on and turning off in second relay are the same as described regarding the first relay.

Capacitor C1 stores the cell voltage. If second relay 1122 is turned on, second relay 1122 receives the stored cell voltage from capacitor C1, and transmits the stored cell voltage to differential amplification terminal 1123. Differential amplification terminal 1123 amplifies the transmitted cell voltage, and generates an output voltage.

A/D converter 120 converts the output voltage transmitted from differential amplification terminal 1123 to a signal that MCU 20 can recognize, and transmits the converted signal to MCU 20.

FIG. 3 illustrates waveforms of first control signals S1_1 to S1_40, second control signal S2, and third control signal S3 that are generated to control voltage sensing unit 110 of sensing unit 10, which is constructed as an exemplary embodiment of the present invention. The waveforms of shown in FIG. 3 are represented as a function of time. As described above, MCU 20 generates a first sampling signal or a second sampling signal depending on the operation state of the vehicle. The waveforms shown in FIG. 3 are control signals of one of the first sampling signal or the second sampling signal. The difference of the waveforms of the control signals of the first and second sampling signal will be described later.

Each of first control signals S1_1 to S1_40 has a first level and a second level. According to an exemplary embodiment of the present invention, the first level is set to be higher than the second level, and therefore, the first level can be represented as a pulse as shown in FIG. 3. The time period in which a first level is applied is sequentially arranged among first control signals S1_1 to S1_40. At a given sampling signal, cell relays 111_1 to 111_40 receive first control signals S1_1 to S1_40, respectively, from MCU 20. Each of cell relays 111_1 to 111_40 is turned on at a time period in which a first level is applied, and is turned off at a time period in which a second level is applied.

As shown in FIG. 3, during first time period T1, first control signal S1 and second control signal S2 are at a first level. Therefore, in first time period T1, cell relay 111_1 is turned on in response to first control signal S1_1, and first relay 1121 is turned on in response to second control signal S2. In this case, battery cell CELL1 is electrically connected to capacitor C1 through first relay 1121, and capacitor C1 is charged in proportion to the voltage of battery cell CELL1. During the time period T1, third control signal S3 is at a second level, and therefore second relay 1122 is in a turn-off state in response to third control signal S3.

In second time period T2, cell relay 111_1 and first relay 1121 are turned off in response to first control signal S1_1 and second control signal S2, respectively, while second relay 1122 is turned on in response to third control signal S3. Third control signal S3 is at a first level during third time period T3, which is included in second time period T2. Accordingly, second relay 1122 transmits charges stored in capacitor C1, which represents the voltage of battery cell CELL1, to differential amplification terminal 1123.

According to an exemplary embodiment of the present invention, the time periods T2 and T3 can be established by considering magnitude of the capacitance of capacitor C1 and response speeds of first relay 1121 and second relay 1122.

The same operations as applied during the time period T1 and T2 are repeated with other first control signals S1_2 through S1_40 until rest of cell relays 111_2 to 111_40 respond to the corresponding control signals.

In an embodiment of the present invention, MCU 20 adjusts the length of first time period T1 to switch from one sampling signal to another sampling signal. In one embodiment, the first sampling signal has shorter time period T1 than the second sampling signal. Therefore, in this case, if the vehicle is in a running state, MCU 20 generates a first sampling signal, and the total detection time period, which is required to detect voltages of battery cells CELL1 to CELL40, becomes shorter. The total detection time period required to detect voltages of the battery cells can be referred to as a sampling time. Therefore, the first sampling signal corresponds to a high speed sampling. On the other hand, if the vehicle is in a stopping state, MCU 20 generates a second sampling signal. Because first time period T1 of the second sampling signal is longer than that of the first sampling signal, the total detection time period, which is required to detect voltages of battery cells CELL1 to CELL40, becomes longer. Therefore, the second sampling signal corresponds to a low speed sampling.

Second control signal S2 is input from MCU 20 to control first relay 1121. During first time period T1, a first level of second control signal S2 is applied, and first relay 1121 is turned on. Therefore, voltage of battery cell is applied to voltage detecting unit 112, and is transmitted to capacitor C1. During second time period T2, cell relays 111_1 to 111_40 and first relay 1121 are turned off. Therefore, the cell voltage stored in capacitor C1 is not interrupted. Moreover, in second time period T2, second relay 1122 is turned on during third time period T3. Therefore, the cell voltage stored in capacitor C1 is transmitted to differential amplification terminal 1123.

According to an exemplary embodiment of the present invention, the number of cells of the battery is given as forty, but the number is not limited thereto. Accordingly, the number of cell relays may be changed in correspondence to the total number of the battery cells.

In a battery management system and a driving method thereof using a voltage detecting unit, which is constructed as an exemplary embodiment of the present invention, cell voltage detection is performed according to an operation state of a vehicle. Cell voltage detection is performed at high speed for the stability of the battery during the driving of the vehicle, and is performed at low speed for the accurate detection of the cell voltage when the vehicle is stopped or parked.

According to an exemplary embodiment of the present invention, the battery voltage is measured while the sampling time is differently controlled on a running and stopping state. A battery voltage may be more accurately measured when stability is improved in the running state of the vehicle, and may be more accurately measured when a stabilizing time of the capacitor is improved in the stopping state.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A battery management system coupled to a battery having a plurality of cells in a vehicle, the battery management system comprising:
    a sensing unit coupled to the battery, the sensing unit detecting a voltage of each cell of the battery; and
    a main control unit coupled to the sensing unit, the main control unit determining an operation state of the vehicle, the main control unit generating a first sampling signal when the operation state is a first state and generating a second sampling signal different from the first sampling signal when the operation state is a second state different from the first state, the first and second sampling signals being provided to the to the sensing unit to control a sampling speed in detecting the voltage of each cell.

2. The battery management system of claim 1, the first state being a running state and the second state being a stopping state.

3. The battery management system of claim 1, each of the first sampling signal and the second sampling signal comprising:
    a first control signal having a first level and a second level, the first control signal controlling a sequential sampling of the battery cells in sequentially detecting the voltage of each cell;
    a second control signal having a first level and a second level, the second control signal controlling storage of the detected voltage of each cell; and
    a third control signal having a first level and a second level, the first level of the third control signal being applied during a time period in which the first control signal is at the second level and the second control signal is at the second level, the third control signal controlling read out and amplification of the stored voltages.

4. The battery management system of claim 3, the first state being a running state and the second state being a stopping state.

5. The battery management system of claim 3, the sensing unit being a voltage sensing unit comprising:
- a plurality of cell relays, each cell being connected to a corresponding one of the cell relays, the first control signal controlling each of the cell relays;
- a first relay connected to each of the cell relays;
- a storage capacitor connected to the first relay, the second control signal controlling the first relay to store the detected voltage of each cell in the storage capacitor;
- a second relay connected to the storage capacitor, the third control signal controlling read out of the stored voltages from the capacitor; and
- a differential amplifying terminal, the differential amplifying terminal receiving and amplifying the read out voltages.

6. The battery management system of claim 5, further comprising an analog to digital converter converting the amplified read out voltages to digital data, the digital data being provided to the main control unit.

7. The battery management system of claim 5, the first control signal comprising a corresponding plurality of cell relay control signals to control the sequential sampling of the battery cells in sequentially detecting the voltage of each cell, each cell relay control signal having a single pulse having a first time period.

8. The battery management system of claim 7, the second control signal comprising a plurality of pulses, each having the first time period.

9. The battery management system of claim 8, the third control signal comprising a plurality of pulses, the time period of each pulse having the first level being shorter than the first time period.

* * * * *